United States Patent
Niitsu et al.

(10) Patent No.: US 8,475,181 B2
(45) Date of Patent: Jul. 2, 2013

(54) CAPACITIVELY COUPLED CONNECTOR FOR FLEXIBLE PRINTED CIRCUIT APPLICATIONS

(75) Inventors: Toshihiro Niitsu, Tokyo (JP); Hideo Nagasawa, Kanagawa (JP)

(73) Assignee: Molex Incorporated, Lisle, IL (US)

( * ) Notice: Subject to any disclaimer, the term of this patent is extended or adjusted under 35 U.S.C. 154(b) by 215 days.

(21) Appl. No.: 12/997,302

(22) PCT Filed: Apr. 28, 2009

(86) PCT No.: PCT/US2009/041879
§ 371 (c)(1),
(2), (4) Date: Feb. 25, 2011

(87) PCT Pub. No.: WO2009/151803
PCT Pub. Date: Dec. 17, 2009

(65) Prior Publication Data
US 2011/0159711 A1    Jun. 30, 2011

Related U.S. Application Data

(60) Provisional application No. 61/131,524, filed on Jun. 10, 2008.

(51) Int. Cl.
*H01R 12/00* (2006.01)
(52) U.S. Cl.
USPC .................................................. 439/67
(58) Field of Classification Search
USPC .............. 439/67, 65, 492, 495–496, 329, 357
See application file for complete search history.

(56) References Cited

U.S. PATENT DOCUMENTS

| | | | |
|---|---|---|---|
| 5,403,202 A * | 4/1995 | Roehling | 439/493 |
| 5,432,486 A | 7/1995 | Wong | |
| 5,574,273 A | 11/1996 | Nakagawa et al. | |
| 5,936,841 A | 8/1999 | Kantner et al. | |
| 6,007,359 A * | 12/1999 | Kosmala | 439/329 |
| 6,162,083 A | 12/2000 | Seto | |
| 6,317,011 B1 | 11/2001 | Barnett et al. | |
| 6,733,325 B2 * | 5/2004 | Sakai et al. | 439/495 |
| 7,367,812 B2 * | 5/2008 | Shih et al. | 439/65 |
| 7,377,804 B2 * | 5/2008 | Lin | 439/499 |
| 7,530,839 B1 * | 5/2009 | Lee | 439/496 |
| 7,618,282 B2 * | 11/2009 | Wu et al. | 439/496 |
| 2005/0176301 A1 | 8/2005 | Barr | |
| 2005/0206603 A1 | 9/2005 | Kawachi et al. | |
| 2007/0023921 A1 | 2/2007 | Zingher et al. | |

FOREIGN PATENT DOCUMENTS

| | | |
|---|---|---|
| EP | 0 188 027 A2 | 7/1986 |
| EP | 1 246 306 A2 | 10/2002 |
| WO | WO 2005/015583 A1 | 2/2005 |

* cited by examiner

*Primary Examiner* — Jean F Duverne
(74) *Attorney, Agent, or Firm* — Timothy M. Morella

(57) ABSTRACT

A FPC connector has an insulative housing with a general U-shape that defines an opening that receives a free end of a length of FPC. The housing has a base and two leg portions and the leg portions have engagement arms that hold engage the FPC free end when inserted into the connector housing opening. A cover of the connector housing has press members that press the FPC and dielectric barriers thereon into contact with contacts on a circuit board.

12 Claims, 8 Drawing Sheets

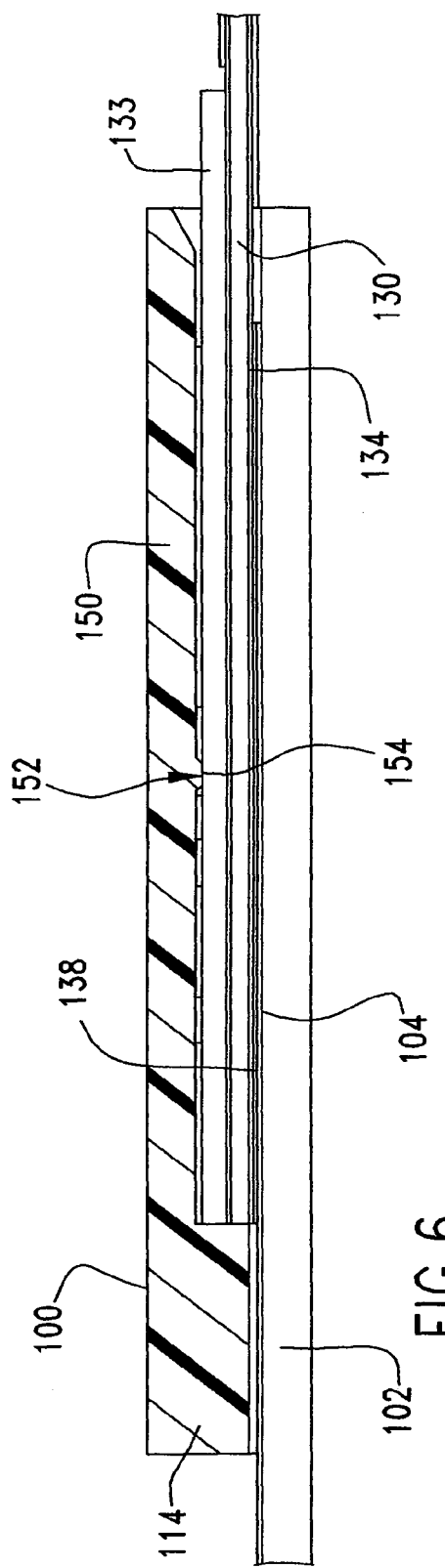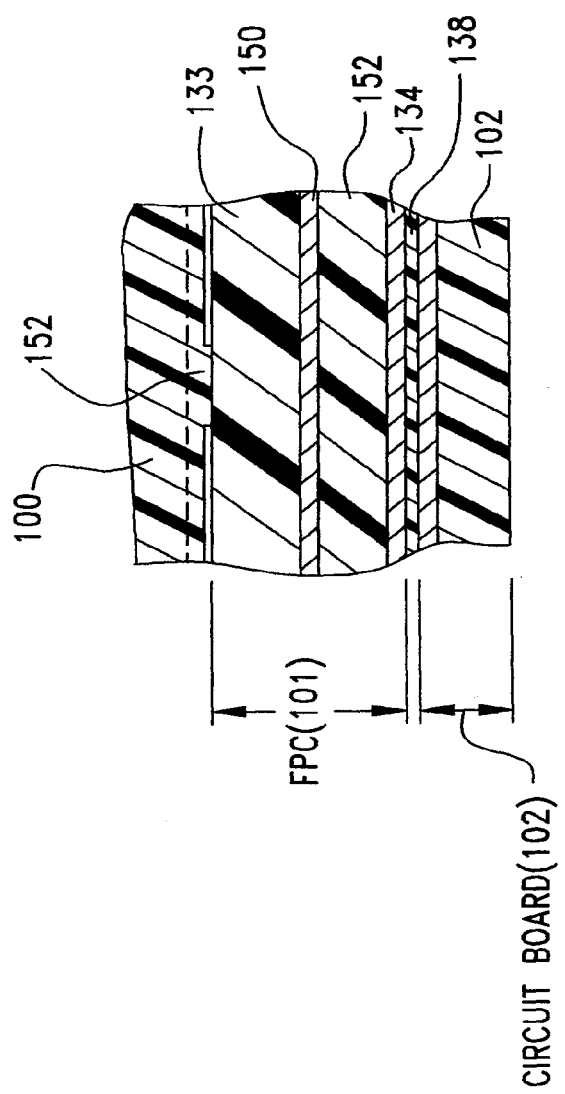

CAPACITIVELY COUPLED CONNECTOR FOR FLEXIBLE PRINTED CIRCUIT APPLICATIONS

BACKGROUND OF THE INVENTION

The Present Invention is generally directed to flexible printed circuit ("FPC") style connectors, and more particularly to an FPC connector that utilizes a capacitive-coupling conductor mating interface to obtain a significantly reduced overall height.

FPC connectors are used in many electronic devices. The industry seeks to reduce the overall size of these devices and FPC connectors, although they can be made small, they are usually expensive and complex to manufacture because they require a movable actuator to force the FPC into contact with the metal terminals of the connector.

Accordingly, the Present Invention is directed to an improved FPC connector that overcomes the aforementioned disadvantages and presents reduced height, size and cost opportunities and which does not utilize conductive terminals.

SUMMARY OF THE INVENTION

It is a general object of the Present Invention to provide an improved FPC connector of reduced height and size which utilizes capacitive coupling to effect signal transmission between the signal transmission conductors on an extent of FPC and the contacts of a circuit board.

Another object of the Present Invention is to provide a connector for connecting a length of FPC to a plurality of contacts on a circuit board, wherein the connector includes a housing having an opening formed therein that receives the mating end of a length of FPC, the housing being mountable to a circuit board and the housing opening encompassing a plurality of contact pads disposed on a surface of the circuit board, the housing including means for retaining the end of the FPC in the opening and means for exerting a pressing force down on the end of the FPC, the FPC further including a dielectric barrier disposed on its conductors that prevent galvanic electrical contact from occurring between the FPC conductors and the circuit board contacts, but permits signal transmission therethrough by way of capacitive coupling.

A further object of the Present Invention is to provide an FPC connector that does not utilize a moveable actuator, but rather utilizes simple insertion movement into a receptacle and the receptacle providing a downward pressure to supply a sufficient contact pressure.

A still further object of the Present Invention is to provide a connector for connecting a length of FPC to a circuit board that does not use metal terminals and which is relatively easy to manufacture, is of low cost and of reduced height.

Yet another object of the Present Invention is to provide an FPC connector that has an insulative connector housing in the form of a hollow, U shaped frame with a center opening that receives a free end of the FPC, the frame having a pair of engagement arms disposed within the interior of the frame for engaging the free end of the FPC and for retaining it in place within the connector housing, the frame including a cover portion that partially encloses the frame center opening, the cover including means for applying a contact pressure to the FPC free end adjacent a circuit board to which the connector is mounted, the contact pressure means including at least a pair of press members disposed on an interior surface of the cover and extending into the housing opening for contacting and pressing the FPC against an opposing circuit board.

The Present Invention accomplishes these and other objects by way of structure. The connector is used for mounting FPC to a circuit board, having a distinct mounting area defined thereon with a plurality of conductive surfaces, typically in the form of contact pads. In the preferred embodiment, the connector has a U-shaped insulative housing that has a central opening cooperatively defined by a base portion and two spaced apart leg portions. The opening or receptacle forms the center part of the "U" shape and defines a receptacle into which an end of the FPC fits. The housing may include one or more fitting nails, or other suitable means, to attach it to the circuit board, such as by soldering. The housing is mounted on the circuit board in a location to enclose the circuit board contacts within the housing opening.

In order to provide a means for retaining the FPC free end in place, the housing leg portions may include a pair of engagement arms that are formed on opposite sides of the opening and these arms may be directly formed within the housing leg portions or they may be separately formed and subsequently attached thereto. The engagement arms, when formed as part of the connector housing, include cantilevered free ends that are bent back upon themselves to provide an outward spring force that presses against the sides of the free end of the opposing directions, widthwise of the receptacle.

The FPC free end is preferably provided with a stiffener member that extends completely widthwise between the edges of the FPC and lengthwise for a predetermined distance. The conductors of the FPC are exposed at the end of the FPC and they take the form of elongated contact surfaces that are spaced apart from each other in the widthwise direction of the FPC and which are dimensional to match the dimensions of the contact pads on the circuit board. If desired, the FPC contact surfaces may be larger than the circuit board contact pads, but it is preferred that they not be larger than 110% of the size of the circuit board contact pads.

The exposed conductive surfaces of the FPC have a dielectric barrier applied to them and this barrier can be in the form of a single member applied to the entire FPC free end, or in the form of multiple members applied singularly to each of the exposed conductive surfaces. It is this dielectric barrier that prevents galvanic contact between the FPC conductors and the circuit board contact pads but permits the transfer of electrical signals by way of capacitive coupling.

To effectuate proper contact between the FPC free end and specifically, its dielectric barrier(s) and the circuit board contacts, the connector housing includes a cover that extends completely from the base and legs portions to cover the central opening or housing receptacle. Thus, when the connector is mounted to a circuit board, the opening extends lengthwise along the circuit board and is preferably open at an end of the circuit board.

The FPC free end is inserted into the opening until the sides, which are provided with notches, engage the engagement arms of the connector housing. In order to apply a downward pressure (or a pressure on the FPC toward the circuit board) the interior of the cover is preferably provided with one or more discrete press members, in the form of bumps, or posts, in the preferred embodiment. These press members downwardly extend from the cover and exert a contact pressure on the FPC free end. They press the FPC and its dielectric barrier into contact with the circuit board contacts, preferably without the presence of an air gap therebetween.

These and other objects, features and advantages of the Present Invention will be clearly understood through a consideration of the following detailed description.

BRIEF DESCRIPTION OF THE FIGURES

The organization and manner of the structure and operation of the Present Invention, together with further objects and advantages thereof, may best be understood by reference to the following Detailed Description, taken in connection with the accompanying Figures, wherein like reference numerals identify like elements, and in which:

FIG. 6 is a sectional view taken through the connector of the Present Invention and through an associated press member thereof with the FPC in place within the connector;

FIG. 9 is an enlarged detail, cross sectional view of the connector, circuit board and FPC.

DESCRIPTION OF THE PREFERRED EMBODIMENTS

While the Present Invention may be susceptible to embodiment in different forms, there is shown in the Figures, and will be described herein in detail, specific embodiments, with the understanding that the disclosure is to be considered an exemplification of the principles of the Present Invention, and is not intended to limit the Present Invention to that as illustrated.

Figure 7:
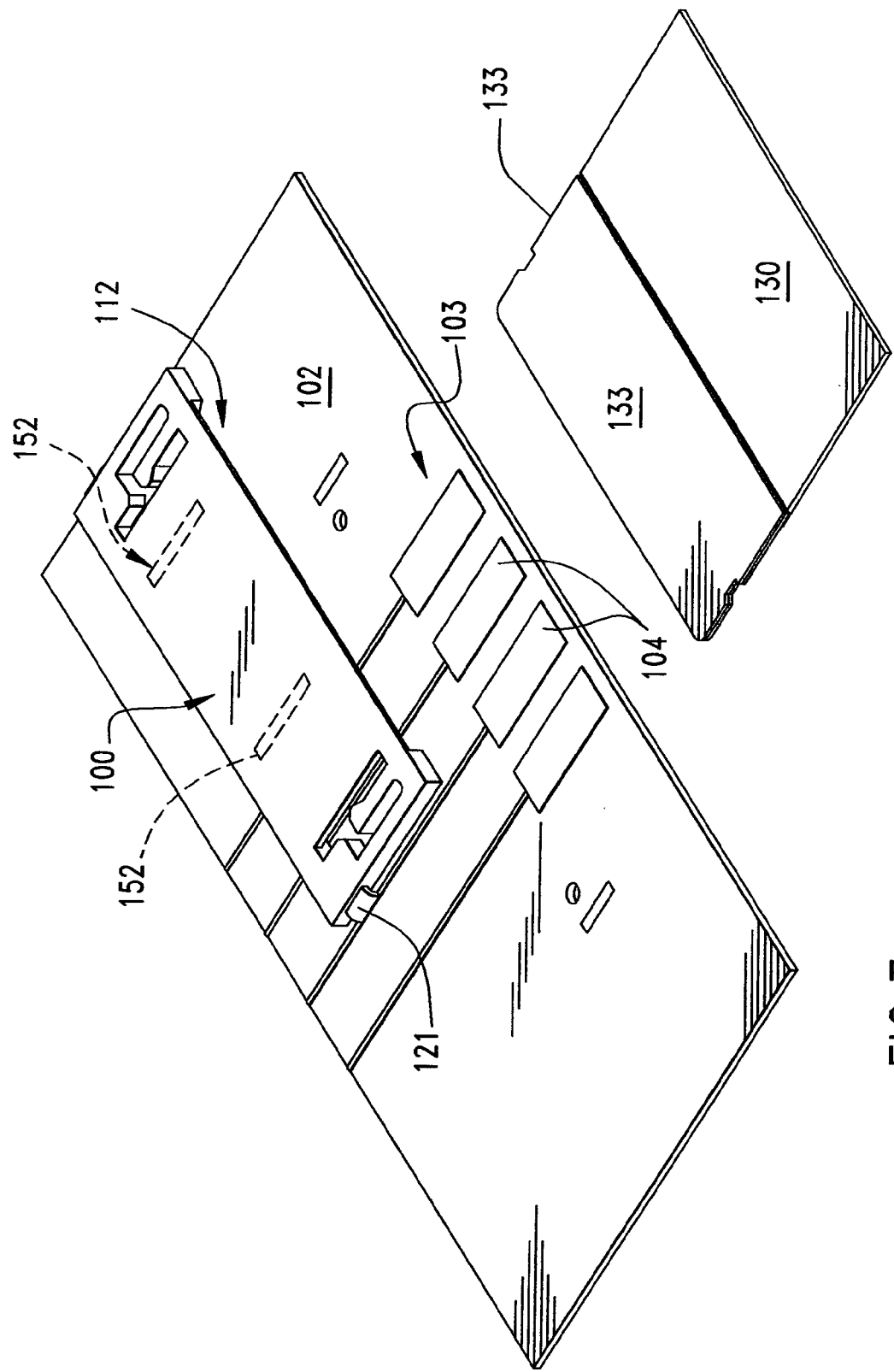
FIG. 7 is an exploded view of the full connector or FIG. 1, showing the location of the contacts on the circuit board.
Figure 8A:
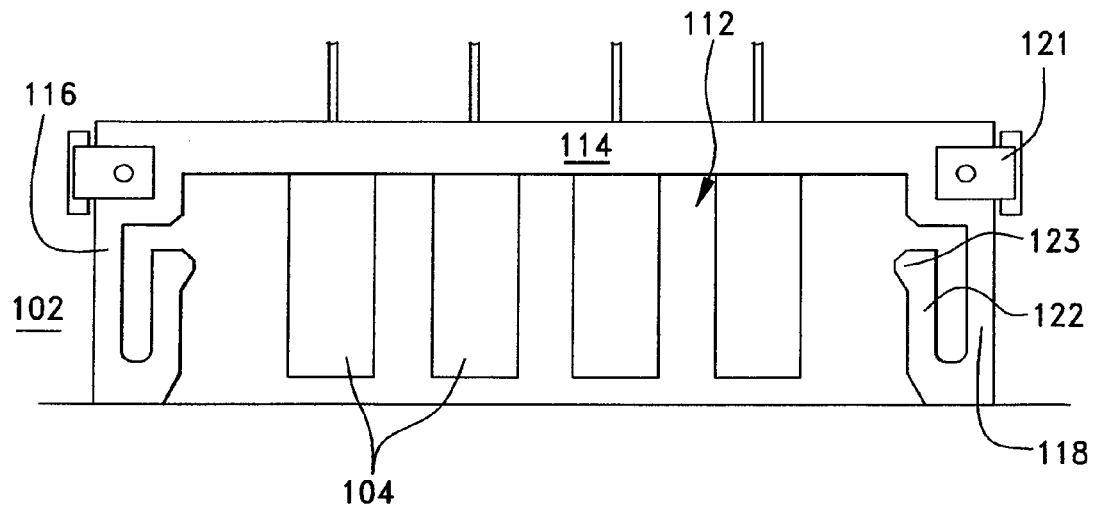
FIG. 8A is a top plan view taken through the connector with the cover removed for clarity showing the circuit board contacts in place within the connector opening.
Figure 8B:
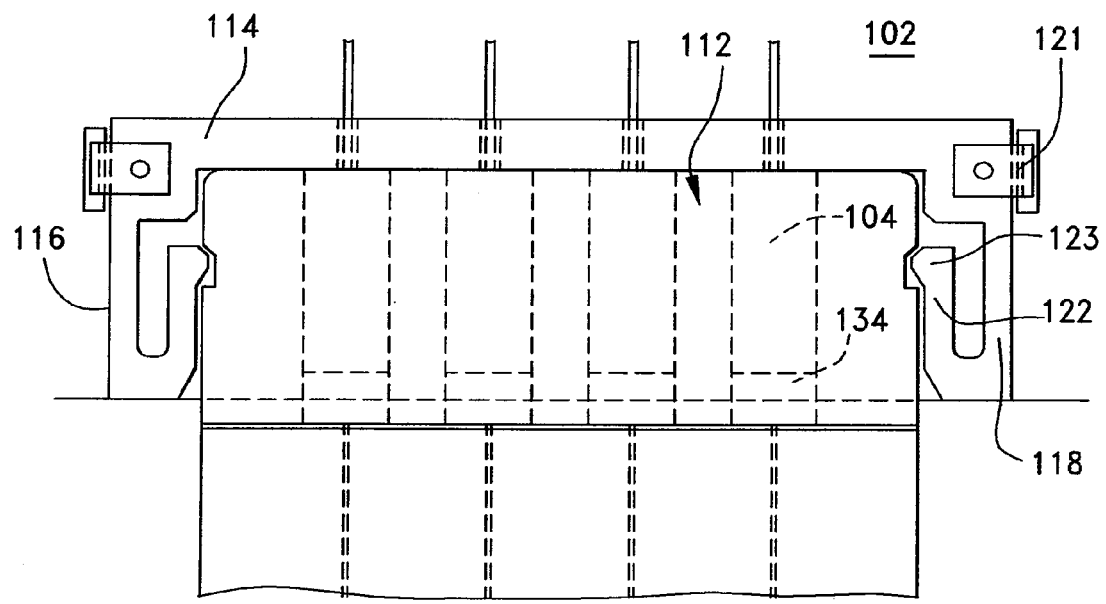
FIG. 8B is the same view as FIG. 8A but with an FPC free end insulated therein showing the alignment of the FPC contacts with the circuit board contacts.

The Present Invention is preferably directed to connector 100 used for mounting FPC 101 to circuit board 102, having distinct mounting area 103 (as illustrated in FIG. 7) defined thereon with a plurality of conductive surfaces, typically in the form of contact pads 104. In a preferred embodiment, connector 100 has U-shaped insulative housing 110 having a central opening or receptacle portion 112, cooperatively defined by base portion 114 and two spaced apart leg portions 116, 118. Central opening 112 forms the center part of the "U" shape, and the receptacle portion of connector 100. Housing 110 may include one or more fitting nails 121, or other suitable means, to attach it to circuit board 102, such as by soldering. When so mounted, housing 110 is mounted to define an interior opening that encloses contact pads 104 within the boundaries of opening 112.

Figure 4:
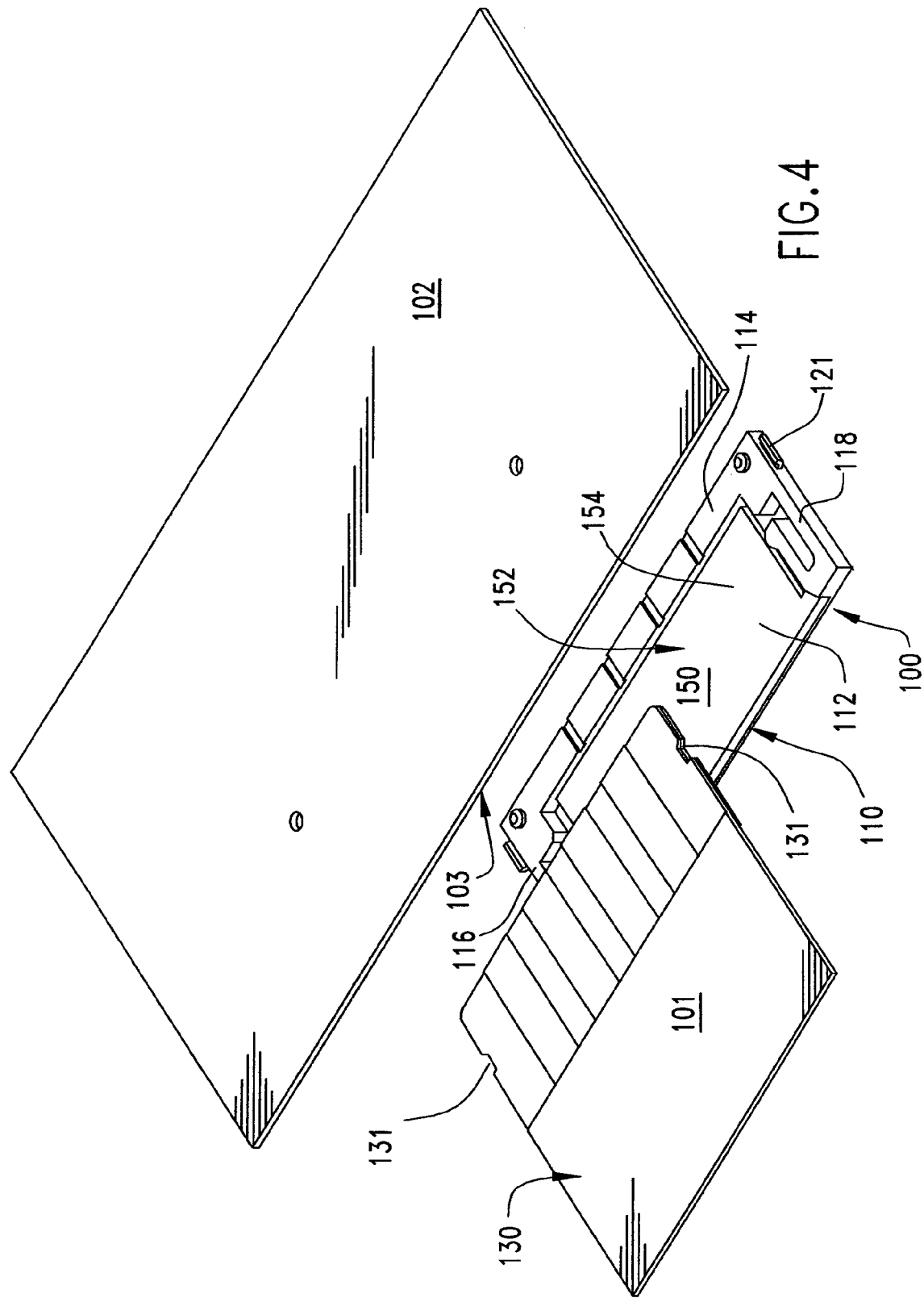
FIG. 4 is an exploded, inverted view of the connector, circuit board and FPC free end of FIG. 1 taken from the underside of the circuit board.
Figure 5:
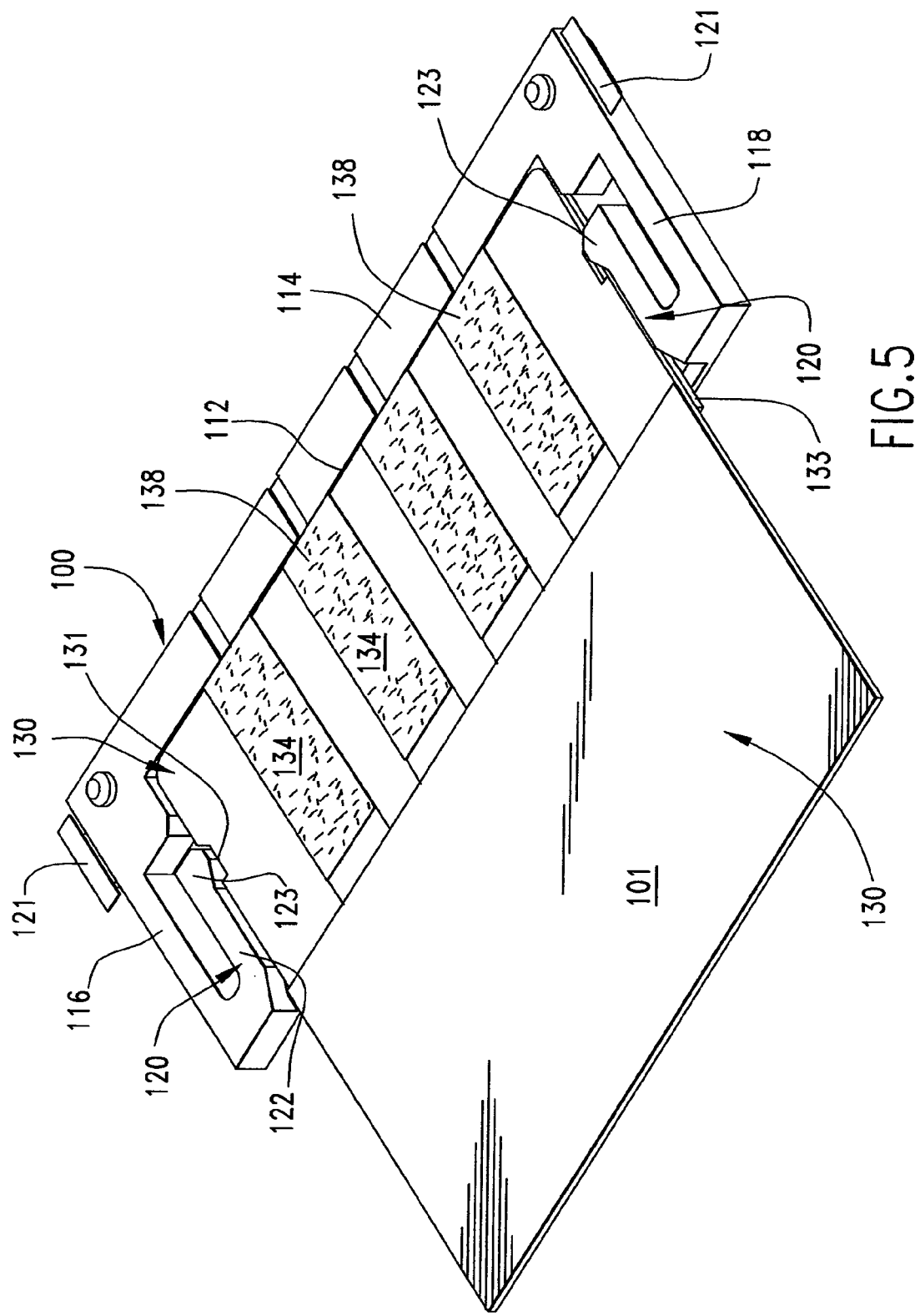
FIG. 5 is an inverted view of the full connector of FIG. 1, with the free end of the FPC engaged in place with the connector opening and the cover removed.

In order to provide a means for retaining free end 130 of the length of FPC 101 in place, housing leg portions 116, 118 may include pair of engagement arms, or members, 120 that are formed on opposite sides of inner opening 112. Engagement arms 120 may be directly formed, as shown in FIG. 5 within housing leg portions 116, 118, or they may be separately formed and subsequently attached thereto. Engagement arms 120, when formed as part of housing 110, include cantilevered free ends 122 each with enlarged engagement head 123. As shown in FIG. 4, free ends 122 are bent back upon themselves (in a general U-shape) to provide an outward spring force that presses against side edges 131 of FPC free end 130 in opposing directions.

FPC free end 130 is preferably provided with stiffener member 133 (FIG. 3) on one surface thereof and that extends completely widthwise between side edges 131 of the FPC and lengthwise for a predetermined distance. Conductors 134 of FPC 101 are exposed at free end 130 of the FPC, and they take the form of elongated contact surfaces 134 that are spaced apart from each other in the width direction of FPC 101 and which are dimensional to match the dimensions of contact pads 104 on circuit board 102. FPC contact surfaces 134 may be larger than contact pads 104, but, preferably are not larger than 110% of the size of contact pads 104.

Exposed conductive surfaces 134 of FPC 101 have dielectric barrier 138 applied to them (FIG. 9), which can be in the form of a single member applied to entire FPC free end 130, or in the form of multiple members applied singularly to each of the exposed conductive surfaces. Dielectric barrier 138 may be applied as a separate member to the conductive surfaces or it may be applied by way of sputtering, printing or the like. This barrier may also take the form of a very thin film and barrier 138 provides a non-galvanic signal transmission medium that is interposed between FPC conductors 134 and contact pads 104 arranged on circuit board 102.

Typically, a film will be used and the dielectric may utilize a plastic, engineered or otherwise, on the order of about 0.015 millimeters thick while in a layer form, the dielectric member may be in the form of a coating that is formed by printing, dipping, painting, sputtering or any other suitable manner. Preferable materials have a high dielectric constant of 200 or more and preferably 300. A suitable dielectric constant for connectors of the Present Invention is between 200 and 300 and this may be achieved either by using a dielectric barrier with a dielectric constant of 300 and ensuring that there is a sufficient contact force applied to the conductors and the dielectric barrier (layer) to press the FPC dielectric barrier portions into reliable contact with the circuit board contact pads so that there is hardly any air gap remaining between the dielectric barriers and contact pads 104 when FPC free end 130 is fully inserted into shell member 200. However, dielectric constants of greater than 40 have been effective.

It has been found that the force required to obtain such intimate contact is much less that that required to effect a normal galvanic connection. For example, it has been discovered that as little as 8.1 grams of force can provide capacitively coupled connectors of the present invention with a capacitance of 11.0 picofarads while a comparable galvanic connector would require 30 grams of force for effective contact. The contact force is an important consideration for it is desirable to eliminate any air gap between the dielectric and the opposing conductor that it is pressed against, for the air gap affects the effective dielectric constant of the two conductors and any interposed dielectric, as well as the capacitance for the assembly. This reduction in required contact force facilitates the miniaturization of connectors of the Present Invention.

Figure 1:
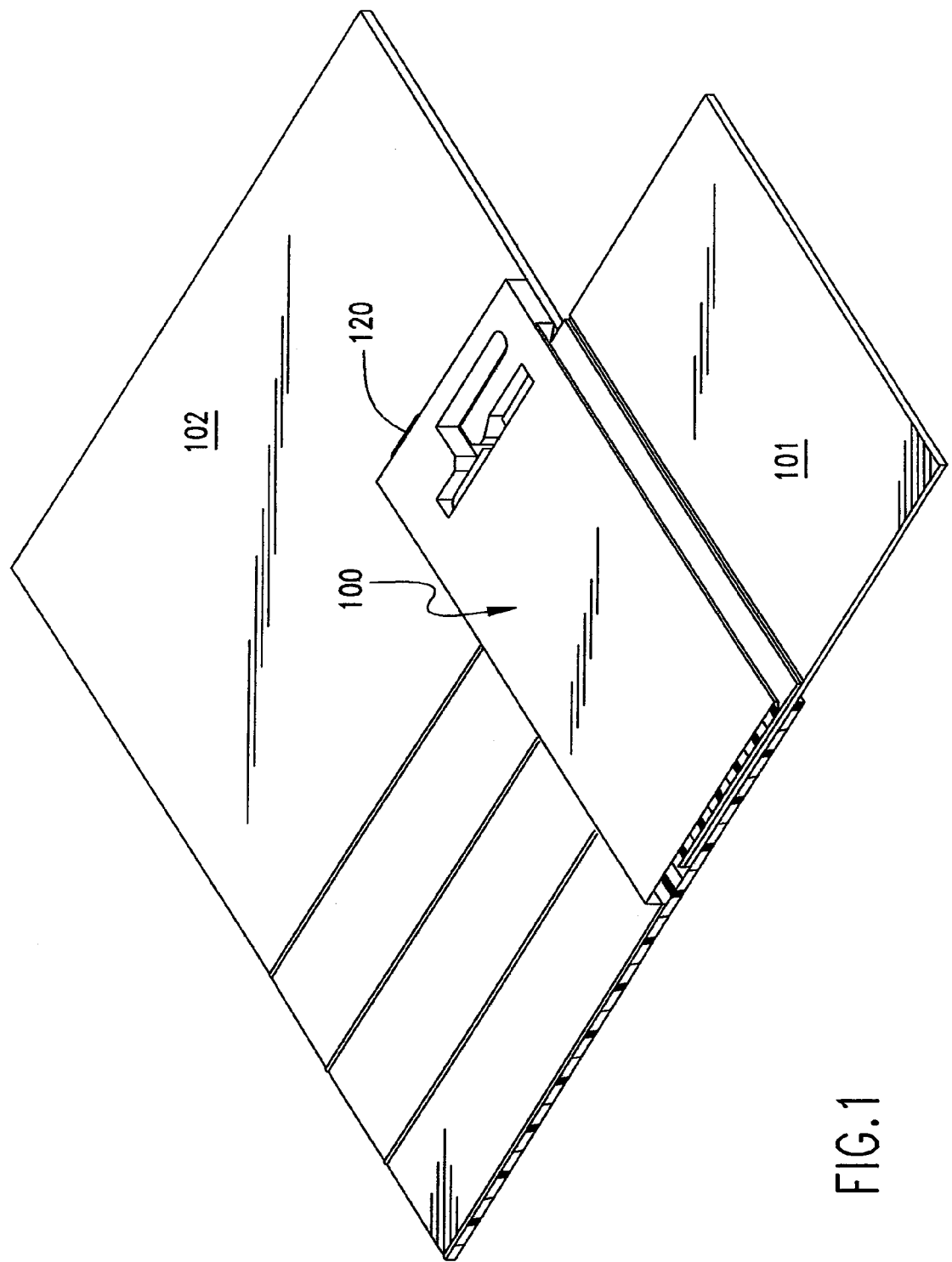
FIG. 1 is a perspective view, partly in section, of a capacitively coupled FPC connector constructed in accordance with the principles of the Present Invention that is mounted to a printed circuit board and into which a free end of a length of FPC is inserted.
Figure 2:
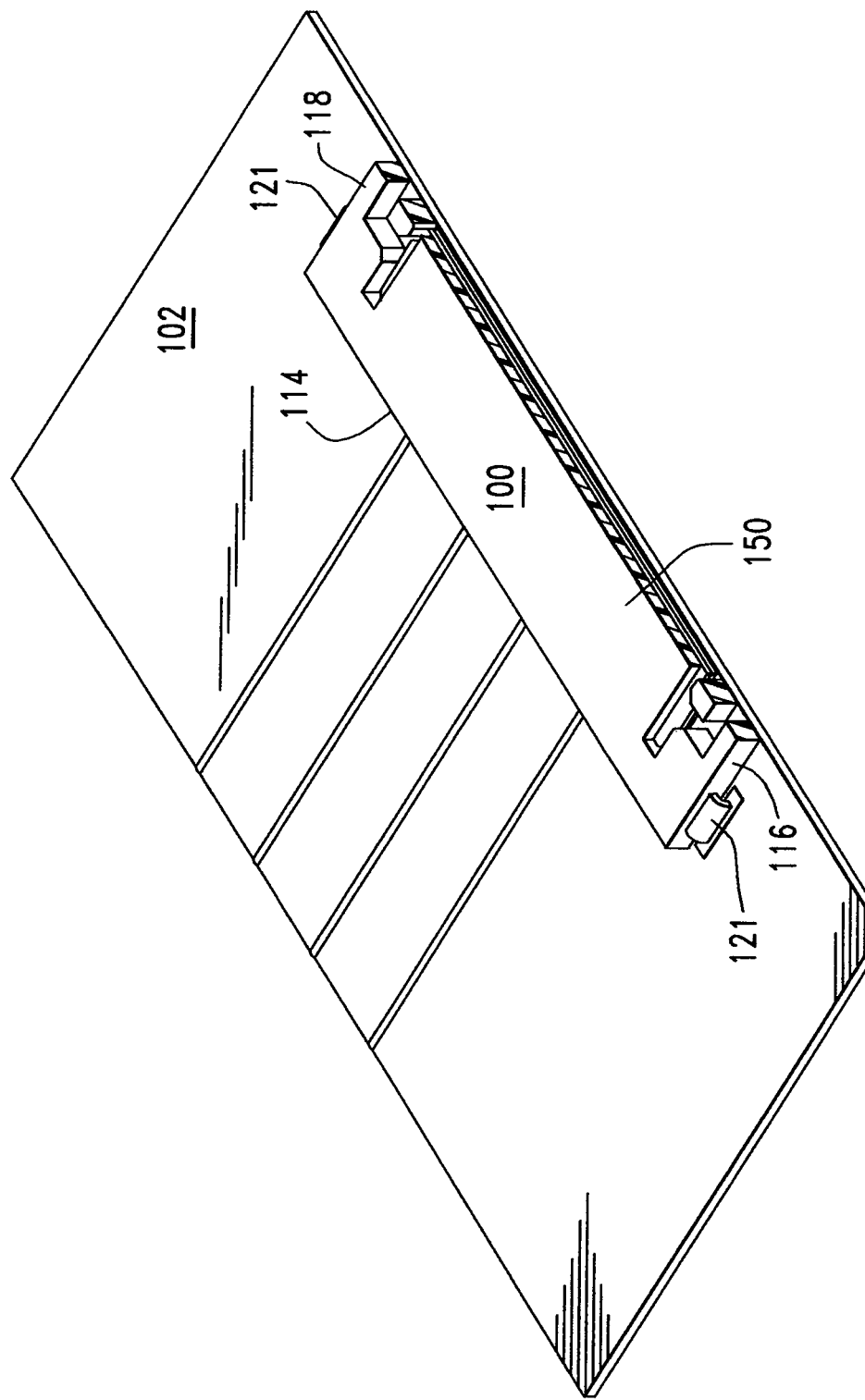
FIG. 2 is the same view as FIG. 1, but with the connector sectioned widthwise along its front face through the engagement arms thereof.
Figure 3:
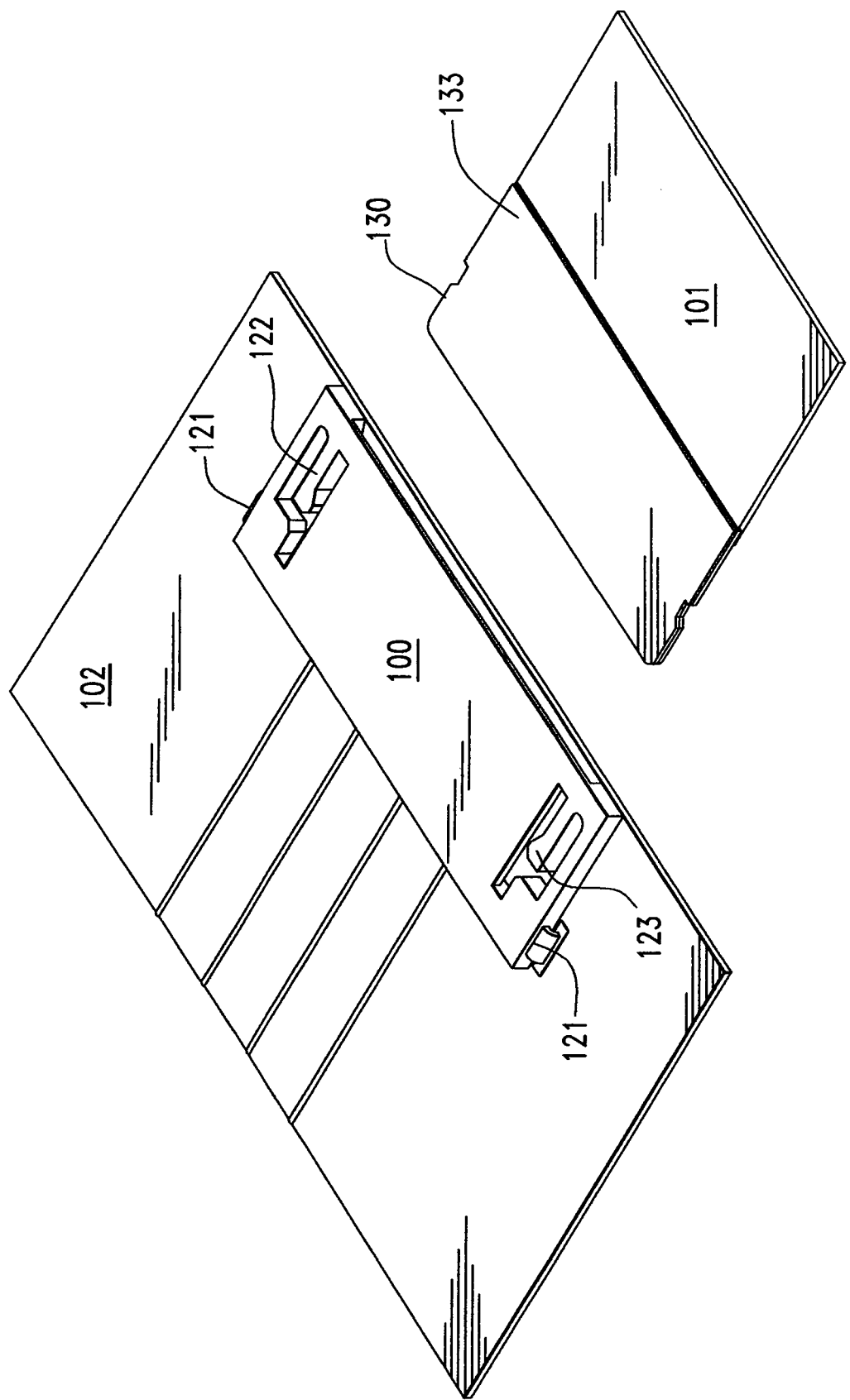
FIG. 3 is the same view of FIG. 2, but with the FPC free end aligned with the connector receptacle prior to insertion.

It is this dielectric barrier 138 that prevents galvanic contact between the FPC conductors and the circuit board contact pads, but permits the transfer of electrical signals by way of capacitive coupling. In order to effect proper contact between FPC free end 130 and specifically, its dielectric barrier(s) and the circuit board contacts, the connector housing includes cover 150 that extends completely from base 114 and leg portions 116, 118 to cover central opening 112. Thus, when connector 100 is mounted to circuit board 102, opening 112 extends lengthwise along circuit board 102 and is preferably open at an end of circuit board 102 as shown in FIG. 3.

FPC free end 130 is inserted into the opening until the sides of it, which are provided with notches, engage engagement arms 122 of connector housing 110. In order to apply a downward pressure (or a pressure on FPC 101 toward circuit board 102) the interior of cover 150 is provided with press members 152, in the form of bumps or posts 154 in the preferred embodiment. These discrete press members 152 extend from the cover and exert a contact pressure on FPC free end 130, as shown in FIG. 6, to press FPC 101 and its dielectric barrier 134 into contact with contact pads 104, preferably without the presence of an air gap therebetween. Press members 152 bear against stiffener 133 that is applied to FPC free end 130. Although multiple press members are shown, it will be understood that a single member may be used, such as forming a downwardly angled surface on the interior surface of cover 150. The press members may also take the form of ramps that extend lengthwise within the opening (as shown in phantom FIG. 7) rather than small bumps or the like.

The dielectric constant will also affect the overall height of the connector assembly in which a dielectric interposer is used. When a dielectric interposer with a dielectric constant of 200 was used in a test connector, electrical signal transfer was accomplished using a contact with dimensions of about 1.5 millimeters by about 4.0 millimeters with a resulting thickness, or height, taken through the contact and dielectric material of about 0.2 millimeters. However, when a material with a dielectric constant of 300 was used, the contact size could be reduced down to about 0.2 millimeters by about 1.5 millimeters and the thickness was reduced down to about 0.015 millimeters.

It has been found that metallic oxides provide a useful dielectric constant and the oxides may be applied to conductive surfaces 134 by way on individual application or enhanced oxidation. Two such oxides that give desirable results are titanium and copper oxide with other oxides being suitable, such as aluminum, chromium and nickel oxides. Ceramic materials may also be used and are suitable for coating application of application by way of thin sheets of ceramic. It is preferred that the thickness of dielectric barrier 138 is less than the thickness of conductive surfaces 134 and thicknesses of dielectric barrier 138 can range from between about 20,000 nanometers (0.2 millimeters) and 300 nanometers (0.0003 millimeters) thick. Such dielectrics are best applied in a coating manner, such as by sputtering.

While a preferred embodiment of the Present Invention is shown and described, it is envisioned that those skilled in the art may devise various modifications without departing from the spirit and scope of the foregoing Description and the appended Claims.

What is claimed is:

1. A connector assembly for providing a capacitively coupled connection between a plurality of conductive traces on a free end of a length of flexible printed circuitry ("FPC") and a plurality of planar contacts disposed on a circuit board, the assembly comprising:
   a housing, the housing including a base, two side walls and a cover, each of the base, the two side walls and the cover cooperatively define an interior receptacle in the housing that encloses contact pads associated with the conductive traces; and
   a length of FPC having a free end, the free end including a plurality of conductive planar contact surfaces disposed on one surface thereof and a stiffener disposed on the opposite surface, the side edges of the FPC having a pair of notches formed therein, the FPC including a dielectric barrier disposed on the conductive planar contact surfaces to provide a non-conductive member interposed between the conductive planar contact surfaces and opposing conductive traces of the circuit board;
   wherein:
      the housing further includes a pair of engagement arms for engaging the notches to hold the free end in place within the interior receptacle; and
      the cover includes means for exerting pressure on the FPC free end to force the dielectric barriers into contact with the contact pads.

2. The connector assembly of claim 1, wherein the pressure exerting means includes a plurality of press members disposed on an interior surface of the cover.

3. The connector assembly of claim 2, wherein the press members are spaced apart widthwise on the interior surface of the cover.

4. The connector assembly of claim 2, wherein the press members include ramps, disposed on the interior surface of the cover, which extend lengthwise within the interior receptacle.

5. The connector assembly of claim 2, wherein the press members extend along the entire exposed interior surface of the cover.

6. The connector assembly of claim 1, wherein the housing further includes a pair of sidewalls flanking the interior receptacle.

7. The connector assembly of claim 6, wherein the engagement arms are disposed on the sidewalls.

8. The connector assembly of claim 1, wherein the engagement arms are bent back upon themselves to provide a spring force thereto.

9. The connector assembly of claim 8, wherein the engagement arms have a general U-shape.

10. The connector assembly of claim 1, wherein the engagement arms are cantilevered with enlarged head portions.

11. The connector assembly of claim 1, wherein the dielectric barrier includes a ceramic layer.

12. The connector assembly of claim 7, wherein the engagement arms extend at least partially into the interior receptacle.

* * * * *